US008564964B2

(12) United States Patent
Nakashima et al.

(10) Patent No.: US 8,564,964 B2
(45) Date of Patent: Oct. 22, 2013

(54) BUSBAR-BLOCK MOUNTING STRUCTURE

(75) Inventors: Akinori Nakashima, Shizuoka (JP); Hiroki Shiraiwa, Shizuoka (JP); Kazuomi Kiyosue, Shizuoka (JP); Tomohiro Sugiura, Shizuoka (JP); Noriyoshi Yamazaki, Shizuoka (JP); Minoru Umezaki, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 510 days.

(21) Appl. No.: 12/735,196

(22) PCT Filed: Dec. 3, 2008

(86) PCT No.: PCT/JP2008/071932
§ 371 (c)(1),
(2), (4) Date: Sep. 7, 2010

(87) PCT Pub. No.: WO2009/081701
PCT Pub. Date: Jul. 2, 2009

(65) Prior Publication Data

US 2010/0328908 A1 Dec. 30, 2010

(30) Foreign Application Priority Data

Dec. 21, 2007 (JP) ................................. 2007-329991

(51) Int. Cl.
*H02B 1/20* (2006.01)
*H05K 5/00* (2006.01)

(52) U.S. Cl.
USPC .......................................... 361/730; 361/611

(58) Field of Classification Search
USPC .................................................. 361/730, 611
See application file for complete search history.

(56) References Cited

U.S. PATENT DOCUMENTS 4,599,679 A * 7/1986 Baader .......................... 361/648
4,963,099 A 10/1990 Sato et al.

(Continued)

FOREIGN PATENT DOCUMENTS

EP 0438120 A1 7/1991
EP 0852456 A1 7/1998

(Continued)

OTHER PUBLICATIONS

Notification of Reasons for Refusal with a dispatch date of Jun. 26, 2012 for corresponding Japanese Patent Application 2007-329991 with translation.

(Continued)

*Primary Examiner* — Timothy Thompson
*Assistant Examiner* — Nathan Milakovich
(74) *Attorney, Agent, or Firm* — Edwards Wildman Palmer LLP

(57) ABSTRACT

Bus bars each having on one side a terminal portion for connection of an electrical component and on the other side a terminal portion for connection of circuit board are provided in an insulating block body parallel to each other to constitute a busbar block. The bus bars are prevented from uplifting by virtue of a rib integral with the block body. Recessed portions for positioning are provided in an insulating cover corresponding to the ribs, and at the same time as the busbar block is attached to the cover, the ribs are brought into engagement with the recessed portions to provide positioning of the busbar block. Terminal block constructed by terminals each having on one end thereof a terminal portion for connection of an electrical component and on the other side thereof a terminal portion for connection of circuit board, and an insulating block body holding the terminals.

8 Claims, 5 Drawing Sheets

(56) References Cited

U.S. PATENT DOCUMENTS

| | | | | |
|---|---|---|---|---|
| 5,112,233 | A * | 5/1992 | Lybrand | 439/79 |
| 5,160,274 | A * | 11/1992 | Ozaki et al. | 439/212 |
| 5,490,794 | A * | 2/1996 | Kobayashi et al. | 439/212 |
| 6,875,923 | B2 * | 4/2005 | Egawa et al. | 174/68.2 |
| 7,448,885 | B2 * | 11/2008 | Wagener | 439/116 |
| 7,713,070 | B2 * | 5/2010 | Sasaki et al. | 439/76.1 |
| 7,760,511 | B2 * | 7/2010 | Sasaki et al. | 361/752 |
| 8,130,070 | B2 * | 3/2012 | Shibata | 337/283 |
| 2004/0001319 | A1 | 1/2004 | Kawakita et al. | |
| 2005/0233619 | A1 * | 10/2005 | Takeuchi et al. | 439/76.2 |
| 2006/0134948 | A1 * | 6/2006 | Yamamoto et al. | 439/76.2 |
| 2006/0141822 | A1 * | 6/2006 | Ozawa et al. | 439/76.1 |
| 2006/0141824 | A1 * | 6/2006 | Kubota et al. | 439/76.2 |
| 2006/0211300 | A1 * | 9/2006 | Kubota et al. | 439/535 |
| 2006/0292904 | A1 * | 12/2006 | Kanou | 439/76.2 |
| 2007/0049070 | A1 * | 3/2007 | Fujimaki | 439/76.2 |
| 2007/0202753 | A1 * | 8/2007 | Murakami et al. | 439/701 |
| 2008/0247133 | A1 * | 10/2008 | Ito | 361/687 |
| 2010/0263915 | A1 * | 10/2010 | Shiraiwa et al. | 174/252 |
| 2010/0317241 | A1 * | 12/2010 | Sugiura et al. | 439/733.1 |
| 2011/0043969 | A1 * | 2/2011 | Shiraiwa et al. | 361/624 |

FOREIGN PATENT DOCUMENTS

| | | | |
|---|---|---|---|
| JP | 55-12728 | | 1/1980 |
| JP | 62-181610 | A | 8/1987 |
| JP | 08079936 | A * | 3/1996 |
| JP | 2000-125449 | A | 4/2000 |
| JP | 2006-333583 | A | 12/2006 |

OTHER PUBLICATIONS

International Search Report dated Feb. 10, 2009, issued on PCT/JP2008/071932.

Supplementary European Search Report dated Feb. 7, 2012, issued for the European patent application No. 08863421.7.

Notification of the First Office Action dated Aug. 2, 2012, issued for the corresponding Chinese Application No. 200880126335.0 and English translation thereof.

* cited by examiner

BUSBAR-BLOCK MOUNTING STRUCTURE

TECHNICAL FIELD

The present invention relates to a busbar-block mounting structure that provides positioning of a busbar block relative to a cover of a junction block and connect the busbar block to the same cover.

BACKGROUND ART

FIG. 8 illustrates principal part of an example of a conventional junction block (see the patent literature PTL 1).

The junction block includes a circuit board 73 incorporating various electronic components 72, connector blocks 75 connected via a terminal 74 to right and left sides of the circuit board 73, a fuse block 77 connected via a terminal 76 to a front side of the circuit board 73. A circuit board assembly 71 constructed by the circuit board 73 and the blocks 75, 77 are covered by upper and lower covers (not shown) with openings 75*a*, 77*a* of the blocks 75, 77 exposed to an outside.

The connector block 75 is constructed by a connector housing (also indicated by the reference sign 75) made of insulating resin and substantially L-shaped terminals 74 whose one end is inserted into the connector housing and the other end is solder-connected to the circuit board 73. Also, the fuse block 77 is constructed by substantially L-shaped terminals 76 whose one end is attached to the fuse holder 78 (a block body) made of insulating resin while the other end thereof is solder-connected to the circuit board 73; a comb-like bus bars (not shown) made of conductive metal and attached to the fuse holder 78; and a connector 80 for power input receiving one side of the bus bar.

Blade-like fuses (not shown) are attached in parallel with each other to the fuse holder 78, in two rows (lower and upper rows) and in a right-to-left direction. Tuning-fork-like terminal portions (the clamping terminals) of the pair of terminals 76 (upper and lower terminals) and a pair of bus bars (upper and lower bus bars) are attached to an inside of the upper and lower accommodating chambers 77*a* corresponding to the pair of terminals (upper and lower terminals) of the fuse. Power supplied from a battery or an alternator is input to the connector 80.

In the patent literature PTL 1, there is also shown an exemplary configuration in which a separate terminal holder (not shown) is coupled to the fuse holder 78, and the multiple-tiered L-shaped terminals 76 (the terminal is used in place of the above-described bus bar) are accommodated in the terminal holder. The circuit board 73 has at its intermediate portion in its thickness direction a copper core layer (not shown).

CITATION LIST

Patent Literature

PTL 1: Japanese Patent Application Laid-Open Publication No. 2006-333583 (FIG. 6, FIGS. 1 and 2)

SUMMARY OF THE INVENTION

Technical Problem

In the above conventional junction block, in proportion to increase in number of components such as a power supply circuit in response to vehicle's grades, it may be in some cases necessary to manufacture a new component having different number of tiers or rows of the fuse block 77, which leads to increase in manufacturing costs.

In particular, in proportion to increase in number of the tiers of the fuse block 77, there is also a drawback that assembling workability in mounting the circuit board assembly 71 (the fuse block portion in particular) to a not-shown cover is degraded. Also, when the fuse is inserted (in particular, when a plurality of the fuses are simultaneously inserted into connecting terminal portions of a single terminal), a strong pressing force may be applied upon the terminal in a direction of insertion, causing undesirable complications to a solder-connecting portion of the circuit board 73.

In view of the above-identified drawbacks, an object of the present invention is to provide a busbar block mounting structure capable of attaching the fuse block to the cover readily and effectively, flexibly adapting to increase the circuits due to upgrading of vehicle, and preventing undesirable impacts upon the connecting portion connecting the circuit board to the fuse block caused by insertion/detachment force of the electrical component such as the fuse.

Solution to Problem

In order to attain the above-identified objective, the busbar block mounting structure according to claim 1 of the present invention includes a plurality of bus bars each having on one side a terminal portion for connection of an electrical component, and on an other side a terminal portion for connection of a circuit board, the bus bars being arranged in parallel with each other on an insulating block body.

The block body includes a rib in one piece therewith, the rib being constructed to prevent uplifting of the bus bars, an insulating cover mounted to the busbar block includes a recessed portion for positioning of the rib, and the rib and the recessed portion brought into engagement with the rib defining positioning of the busbar block with respect to the cover simultaneously with mounting of the busbar block to the cover.

According to the above construction and arrangement, the rib for prevention of uplifting of the bus bars also serves as a positioning element that ensures accurate positioning of the busbar block and the cover relative to each other. The electrical component such as the fuse is connected to the terminal portion for connection of an electrical component to the bus bar.

A force in a longitudinal direction (front-to-rear direction), or a pressing force and a pulling force, acts upon the bus bar as the electrical component is attached and detached. The rib that is brought into abutment with the front or rear end face of the recessed accommodates the force, so that stress loading upon the connecting portion between the terminal portion for connection of circuit board and the circuit board is prevented.

The busbar block mounting structure according to claim 2 of the present invention is the busbar block mounting structure of claim 1, wherein the busbar block and the cover each have a stepwise-bent shape, the block body of the busbar block includes a pair of the ribs, one of the ribs being provided at a front-side bus bar portion of a higher tier of the busbar block, the other of the ribs being provided at a rear-side busbar portion of the lower tier of the busbar block, and the cover includes a pair of the recessed portions for engagement with each corresponding of the pair of the ribs.

According to the above construction and arrangement, the busbar block that needs complicated mounting operation due to its bending shape can be accurately positioned by the front and rear ribs relative to the front and rear recessed portions of the cover for effective assembling operation.

By virtue of the positioning by two points, the accuracy in positioning of the busbar block with respect to the cover is increased. It should be noted that the term "the lower tier" refers to a side closer to the circuit board, and the term "front side" to the side closer to the electrical component.

The busbar block mounting structure according to claim 3 of the present invention is the busbar block mounting structure of claim 2, wherein a terminal block is provided between the higher tier portion of the busbar block and the circuit board, the terminal block being constructed by a plurality of terminals each having at one end a terminal portion for connection of an electrical component and at an other end a terminal portion for connection of the circuit board, and an insulating block body for holding the plurality of terminals.

According to the above construction and arrangement, the busbar block is disposed on the terminal block, the terminal block intended for use with small number of circuits in the case of the low-grade vehicle. Accordingly, it is possible to adapt to a large number of circuits in the high-grade vehicle (increase in the number of circuits).

The busbar block mounting structure of claim 4 of the present invention is the busbar block mounting structure of any one of claims 1 to 3, wherein a circuit board assembly is constructed by (a) the circuit board to which the busbar block is connected and (b) a connector block and/or other electrical components arranged on and connected to the circuit board, and the rib and the recessed portion brought into engagement with the rib defines positioning of the circuit assembly when the circuit board assembly is attached to the cover.

According to the above construction and arrangement, the circuit board assembly is constructed by at least the circuit board, the busbar block, the connector block, and the other electrical component such as the relay, and the circuit board assembly is accurately positioned relative to the cover by virtue of the engagement of the rib with the recessed portion, and connected smoothly and effectively. The circuit board assembly and the cover constitutes the junction block.

Advantageous Effects of the Invention

According to the invention of claim 1, engagement of the recessed portion and the rib provides accurate positioning of the busbar block relative to the cover and smooth, facilitated, and effective mounting thereof, and as a result assembling workability of the junction block along with the busbar block and the cover is improved. Also, the rib for prevention of uplifting of the bus bar also serves as the positioning element.

Thus, it is not necessary to include a separate positioning element, and simple and cost-effective structure can be obtained. Also, the rib abuts on the recessed portion when the electrical component such as the fuse is attached or detached. This construction allows the force in attachment and detachment to be accommodated so that the undesirable impacts upon the connecting portion between the circuit board and the bus bar are prevented, and thereby reliability in connection of the circuit board is improved.

According to the invention of claim 2, the busbar block that needs complicated assembling operation due to its bending shape can be accurately positioned by the front and rear ribs relative to the front and rear recessed portions of the cover to achieve effective mounting operation.

According to the invention of claim 3, by using the busbar block in conjunction with the terminal block, it is possible to use standardized components including the cover and the circuit board, and readily adapt to the increase in number of the circuits in the case of the high-grade vehicle. In this case, the assembly made up of the circuit board, the terminal block, and the busbar block is accurately positioned by the rib and the recessed portion, and can be attached smoothly, readily, and effectively.

According to the invention of claim 4, the circuit board assembly is constituted by at least the circuit board, the busbar block, the connector block, and the other electrical components such as the relay. The circuit board assembly is accurately positioned relative to the cover by the engagement of the rib with the recessed portion to be mounted smoothly and effectively, and thereby the assembling workability of the junction block made up of the circuit board assembly and the cover is improved.

REFERENCE NUMERALS

Figure 1:
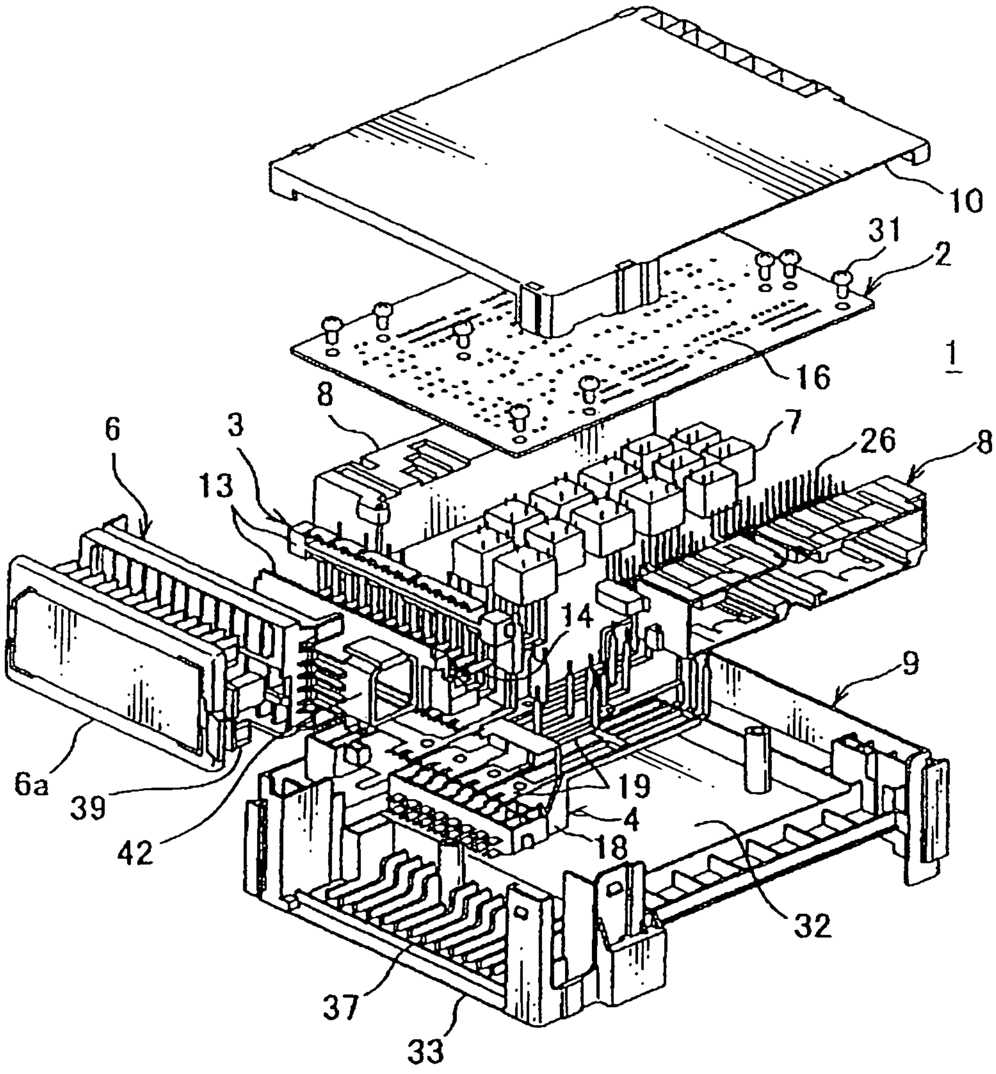
FIG. 1 is an exploded perspective view of a junction block according to one embodiment of the present invention.

2 Circuit board
3 Terminal block
4 Busbar block
7 Relay (other electrical component)
8 Connector block
9 Inner cover (cover)
13 Block body
14 Terminal
14*a*, 14*b* Terminal portion
18 Block body
19 Bus bar
19*a*, 19*b* Terminal portion
19*c*, 19*e* Horizontal portion (bus bar portion).
23 (23(*i*), 23(*ii*)) Rib
25 Circuit board assembly
39 Fuse (electrical component)
50 Recessed groove (recessed portion)
51 Stepwise portion (recessed portion)

DESCRIPTION OF EMBODIMENT

FIG. 1 illustrates a junction block according to one embodiment of the present invention.

The junction block 1 includes: (a) a printed circuit board 2 having a copper core layer (not shown) at an intermediate portion thereof in its thickness direction; (b) a terminal block 3 arranged at a front section of the circuit board 2 and connected to the same circuit board 2, the terminal block being dedicated to low-grade features; (c) a busbar block 4 connected to an intermediate region of the circuit board in its longitudinal direction and configured to be arranged at the front section of the circuit board 2 with the terminal block disposed upon the busbar block 4, the busbar block 4 being dedicated to high-grade features; (d) a fuse holder 6 made of insulating resin and configured to be attached to an assembly 5 (see FIG. 3) consisting of the terminal block 3 and the busbar block 4; (e) a plurality of relays 7 (electrical components) attached and connected to the circuit board 2; (f) connector blocks 8 each arranged on right and left sides of the circuit board 2 and connected to the same circuit board 2; (g) an inner cover 9 (a cover) made of insulating resin and configured to support the terminal block 3, the busbar block 4, the connector block 8, and the fuse holder 6; and (h) an outer cover 10 made of insulating resin and configured to support the circuit board 2 on a side opposite the inner cover 9 in a vertical direction.

In FIG. 1, the busbar block 4 is disposed in a lower position, above which the terminal block 3 is disposed, and the circuit board 2 is disposed above these piled components. This arrangement may be inverted. Orientation or direction such as front, rear, upper, lower, right, and left in the context of the description are only used for convenience sake and they do not necessarily coincide with a direction in which the junction block 1 is mounted.

The junction block 1 may be referred to as "a junction box" or "an electrical junction box." The inner cover 9 and the outer cover 10 may be referred to as "one cover" and "the other cover."

In FIG. 1, a box-like electronic control unit (not shown) is arranged beneath the inner cover 9, and a connector portion 11 (FIG. 7) is arranged on an underside of the circuit board 2 for connecting the electronic control unit to the circuit board 2. The inner cover 9 is secured to a vehicle's body by means of a separate bracket (not shown). The fuse holder 6 includes a cap 6*a* covering the fuse 39 (electrical component).

Figure 2A:
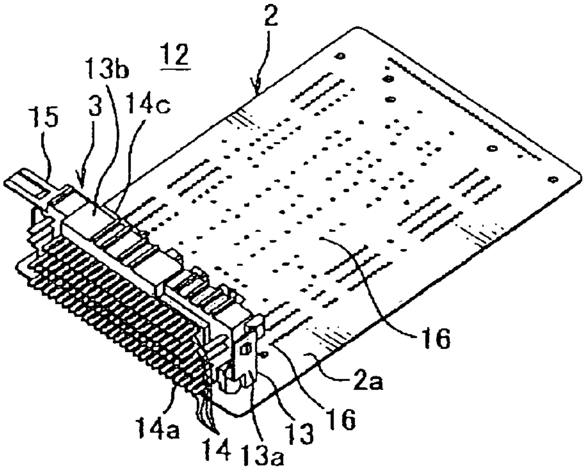
FIGS. 2A and 2B are perspective view and a side view of an exemplary circuit board assembly for low-grade features, respectively.
Figure 2B:
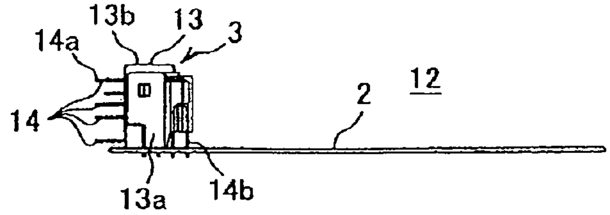

FIGS. 2A and 2B illustrate a circuit board assembly 12 for low-grade features. The terminal block 3 includes a block body 13 (terminal holder) made of insulating resin, and a plurality of substantially L-shaped terminals 14 (bent in an L-shape) arranged juxtaposed to each other in a right-to-left direction and in multiple rows or tiers (four tiers in this embodiment) in the block body 13. The terminal 14 may be a terminal, which is independent from other terminals 14, that may include diapason-like clamping terminal portion 14*a* (the terminal portion for connection of an electrical component) in a second and third tiers from below (with reference to the circuit board). A fourth tier includes a single wide terminal having a plurality of the clamping terminal portions 14*a*. A tab terminal 15 for power input is provided in one piece with the wide terminal.

The terminals 14 are each inserted in a vertical groove or vertical hole (not shown) of the block body 13, and a horizontal portion 14*c* in the neighborhood of a bent portion at an intermediate portion of the terminal 14 abuts against a surface of a horizontal wall of the block body 13 to be supported thereby. It is also possible to mold the terminals 14 in one piece with the block body 13. The block body 13 of this embodiment is constructed by two components, and the two components 13*a*, 13*b* are coupled to each other by means of a locking element, with the upper component 13*b* and the lower component 13*a* sandwiching the terminals 14 therebetween to secure the terminals 14.

A bottom surface of the block body 13 is connected to a surface 2*a* of the circuit board 2. The clamping terminal portion 14*a* of the terminals 14 protrudes from a front end of the block body 13, and a pin-like terminal portion 14*b* of the other end of the terminal 14 is passed through the throughhole of the circuit board 2, and thereby connected to the intermediate copper core layer or to the printed circuit (not-shown) on both sides of the circuit board 2, and the power supply tab terminal 15 protrudes from a lateral end of the block body 13. The copper core layer is sandwiched by front and back insulating substrates.

Figure 3A:
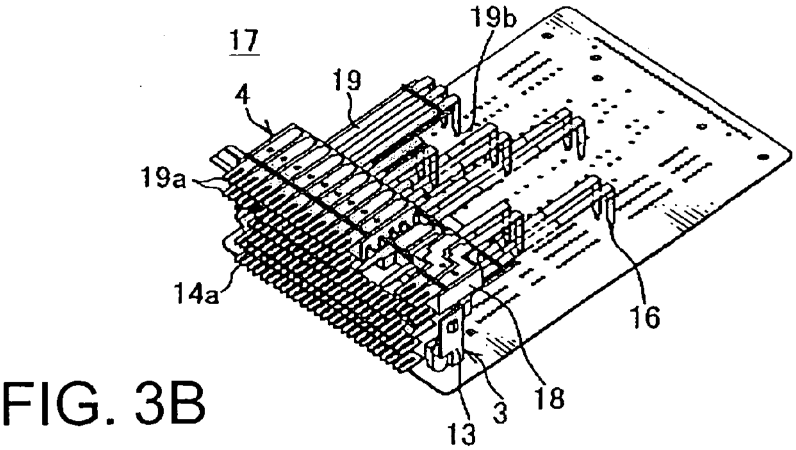
FIGS. 3A and 3B are a perspective view and a side view of an exemplary circuit board assembly for high-grade features, respectively.
Figure 3B:
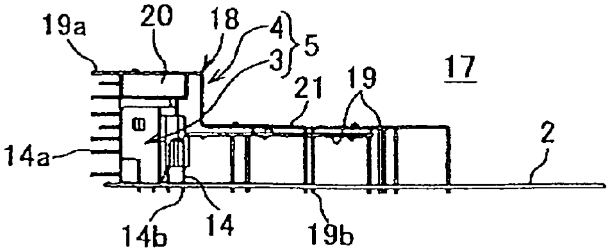

FIGS. 3A and 3B illustrate a circuit board assembly 17 for high-grade features. The circuit board assembly 17 for high-grade features is obtained by incorporating the busbar block 4 for high-grade features onto the circuit board assembly 12 for low-grade features. The present invention provides accurate positioning of the busbar block 4 with respect to the inner cover 9 (see FIG. 1) and thereby allows facilitated and effective mounting operation of the circuit board assembly 17 to the inner cover 9 (details of which will be explained with reference to FIG. 4 and the figures that follow).

Figure 4:
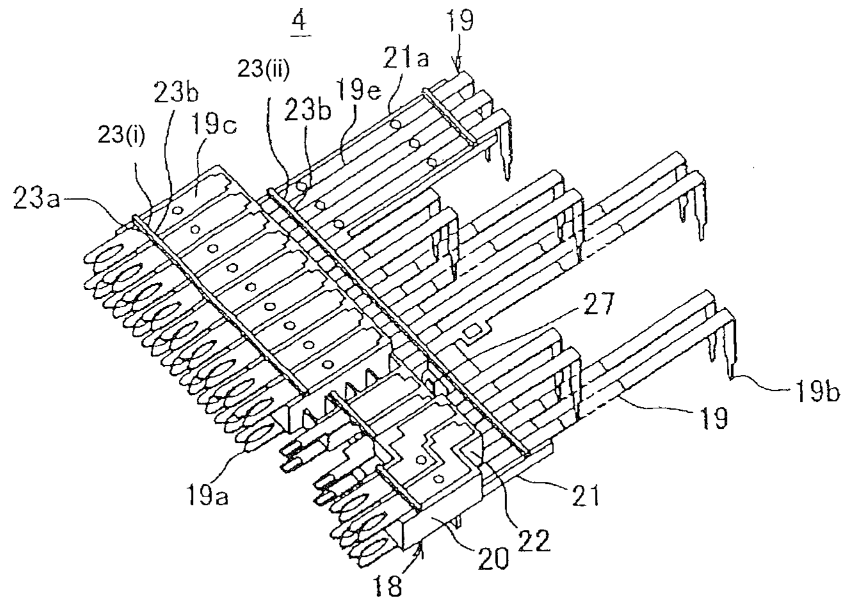
FIG. 4 is a perspective view of an exemplary busbar block for high-grade features.

As shown in FIG. 4, the busbar block 4 includes a block body 18 made of insulating resin and bent stepwise (which is a translation of a Japanese term referring to "in multiple layers, rows, stages, stairs, or tiers") or crankwise (which is a translation of a Japanese term referring to "in a shape of a crank," "in a crank form," etc.) in its side view, and a plurality of power supply bus bars 19 extending in parallel with each other at regular pitches on the front and back side of the block body 18.

The block body 18 is constructed by a plate-like wall 20, which is in a thick, horizontal shape and found in a front side for a higher tier; a plate-like wall 21, which is in a thin, horizontal shape and for a lower tier; and a vertically extending plate-like wall 22 connecting the walls 20, 21 to each other. The wall 21 of the lower tier extends along the bus bar 19 only at a portion 21*a* of the wall 21 along which the upper and lower bus bars 19 are elongated. The bus bar 19 of the lower tier (a fifth tier) is short, and the bus bar 19 of the higher tier (the sixth tier) is long. The bus bars 19 of the higher tier takes disparate lengths and extend linearly in a longitudinal direction of the circuit board 2 (see FIG. 3).

Each of the bus bars 19 is bent stepwise (crankwise) along the block body 18 and includes at its front side a horizontal clamping terminal portion 19*a* for connection of the fuse (terminal portion for connection of the electrical component), and at its rear side a vertical pin-like terminal portion 19*b* for connection of circuit board. The clamping terminal portion 19*a* continues to a horizontal portion 19*c* (i.e., the busbar portion of the higher tier) resting on the same plane, and the horizontal portion 19*c* in turn continues to a vertical portion 19*d* (bent portion) (see FIG. 6). The vertical portion 19*d* continues to a horizontal portion 19*e* (a busbar portion of the lower tier). The horizontal portion 19*e* continues to a downward vertical portion 19*f*. The circuit-board-connection terminal portion 19*b* extends at the vertical portion 19*f*.

The circuit-board-connection terminal portion 19*b* is mainly solder-connected to the intermediate core layer of the circuit board 2 (see FIG. 3). The core layer distributes an electrical power. As shown in FIG. 3, the lower surface of the wall 20 of the higher tier of the busbar block body 18 for high-grade features is brought into abutment with an upper surface of the upper component 13*b* of the terminal block body 13 for low-grade features, and the terminal portion 19*b* of the bus bar 19 is solder-connected to the circuit board 2.

In this embodiment, the bus bar 19 of the higher tier is insert-molded in the block body 18, and the bus bar 19 of the lower tier is secured to the block body 18 by heat-welding. The bus bars 19 on both tiers may be secured by insert molding. The bus bars 19 of the higher tier is protected against uplifting by virtue of the presence of a rib 23 made in one piece with the block body 18 at a lateral side thereof.

Two ribs 23 are each provided in the front-side wall 20 and the rear-side wall 21 of the block body 18, respectively. The front-side rib 23(*i*) secures the front-side horizontal portion 19*c* of the bus bar 19, and the rear-side rib 23(*ii*) secures the horizontal portion 19*e* at the rear side of the bus bar 19. The ribs 23 each have substantially rectangular vertical cross section, and protrude from a surface of the block body 18 in a thickness direction of the bus bar 19. The surface of the bus bar 19 is found on the same plane as the surface of the block body 20.

A bottom surface of the rib 23 is in close contact with the surface of the bus bar 19 and continues integrally to a surface of the block body 18 between the adjacent bus bars 19 in a lateral direction. The ribs 23 for prevention of uplifting of the bus bars also serve as protrusion for positioning in assembling operation of the busbar block 4 (the circuit board assembly 17, or more specifically the assembly 25 of FIG. 7) to the inner cover 9 (FIG. 1).

Figure 5:
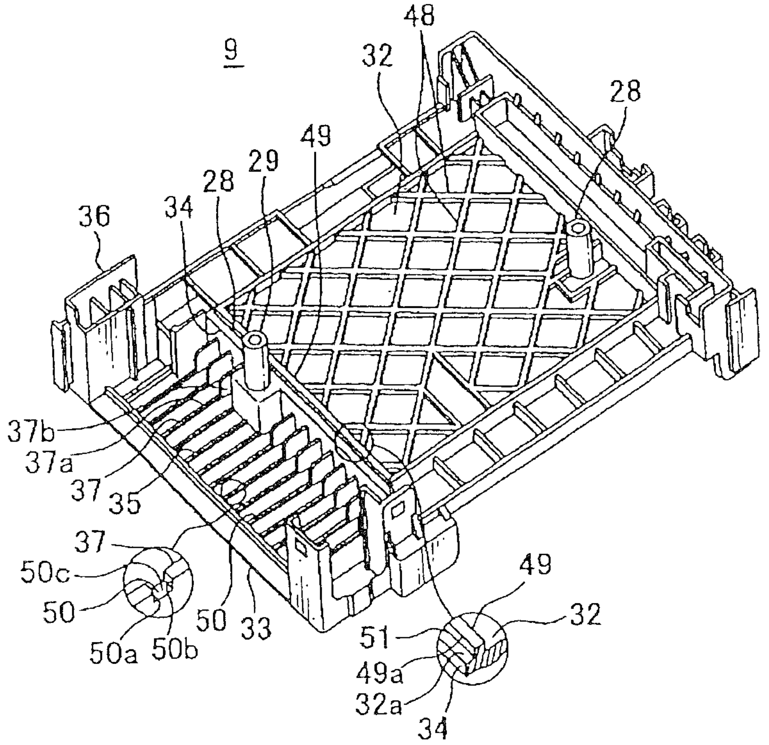
FIG. 5 is a perspective view of an exemplary inner cover.

Referring to FIG. 5, there is shown an example of the inner cover 9. The inner cover 9, in correspondence to the stepwise dimension of the busbar block 4 (see FIG. 4), includes a dugout-like expanded portion 33 on a front end portion of a horizontally extending wide base portion 32. While the busbar block 4 of FIG. 4 is inverted in an up-and-down manner, the wall 20 of the higher tier of the busbar block 4 is arranged corresponding to the expanded portion 33, and the wall 21 of the lower tier is arranged along the base portion 32.

The expanded portion 33 includes a vertical stepwise wall 34 continuing to a front end portion of the base portion 32; a horizontal wall 35 (a second base portion) continuing from the vertical wall 34 frontward by a short length, and a side wall 36 upstanding to a lateral side of the horizontal wall 35. A plurality of ribs 37 are provided on an inner surface of the horizontal wall 35 at regular pitches and in parallel with each other. A columnar portion 38 upstands along the vertical wall 34. A pin 28 upstands from an end of the columnar portion 38.

The rib 37 is constructed by a low-profile protrusion 37*a* elongatedly extending along the horizontal wall 35, and a high-profile protrusion 37*b* (rib) continuing at right angles to the vertical wall 34. The high-profile protrusion 37*b* continues stepwise to the low-profile protrusion 37*a*. The front end portion of the columnar portion 38 and the front end portion of the high protrusion 37*b* are found on the same plane.

A recessed groove 50 (a recessed portion) for positioning of the inner cover 9 relative to the busbar block 4 (see FIG. 4) is provided at a front side of the low-profile protrusion 37*a* of the rib. The recessed groove 50 has a rectangular shape and includes front and rear vertical end faces 50*a*, 50*b* and a horizontal bottom surface 50*c*. The front-side rib 23(*i*) of the busbar block 4 is adapted to be brought into engagement with the recessed groove 50. The front end face 23*a* of the rib 23(*i*) abuts on the front end face 50*a* of the recessed groove 50, and the rear end face 23*b* of the rib 23(*i*) can abut on the rear end face 50*b* of the recessed groove 50.

A trellis-like rib 48 is provided in one piece with an inner surface (bottom surface) of the base portion 32 of the inner cover 9. A rib 49 for positioning of the inner cover 9 relative to the busbar block 4 (see FIG. 4) is provided on the base portion 32, extending linearly in a width direction of the cover in neighborhood of the front-side stepwise wall 34. The trellis-like rib 48 obliquely continues to the positioning rib 49.

A vertical front end face 49*a* of the rib 49 continued at right angles to an inner surface of a horizontal front end portion 32*a* of the base portion 32. The front end portion 32*a* is found in a more frontal space than the rib 49. The front end portion 32*a* in turn continues at right angles to the vertical stepwise wall 34. The front end portion 32*a* and the rib 49 constitute a positioning stepwise portion 51 (recessed portion) in a substantially L-shape. The rear rib 23(*ii*) of busbar block 4 (see FIG. 4) is brought into engagement with a stepwise portion 51. The rear end face 23*b* of the rib 23(*ii*) can abut on the rear end face 49*a* of the stepwise portion 51 (front end face of the rib 49).

Figure 6:
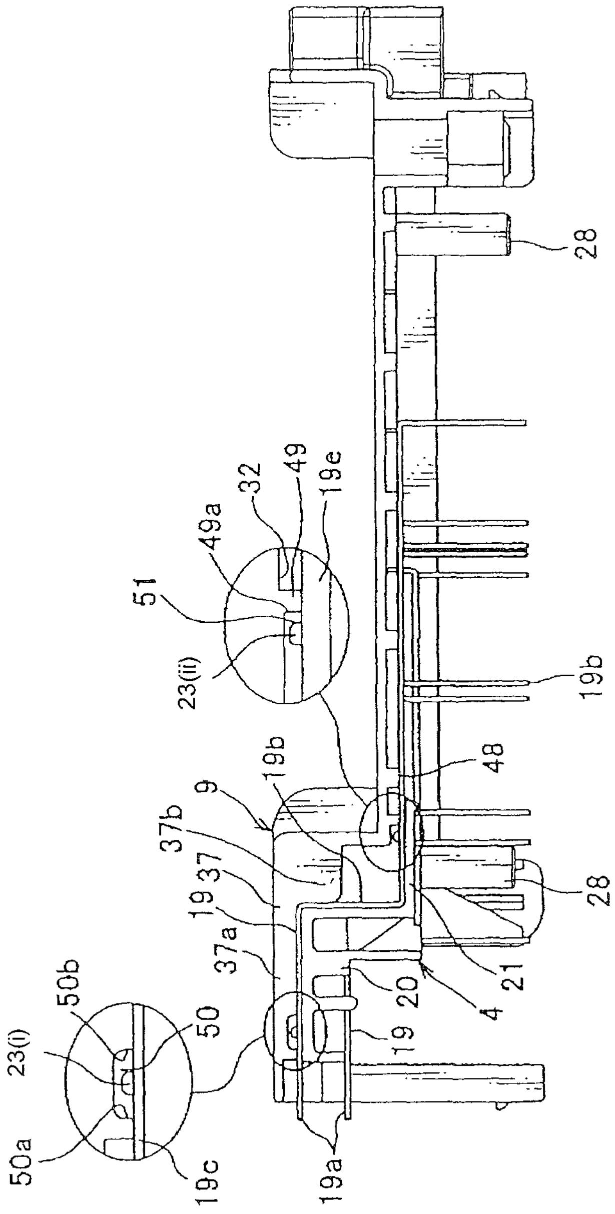
FIG. 6 is a vertical cross-sectional view of a state where the busbar block is arranged on the inner cover as one embodiment of the busbar-block mounting structure of the present invention.

Referring to FIG. 6, there is shown the mounting structure of a busbar block according to one embodiment of the present invention in a state where the inner cover 9 of FIG. 5 is inversely attached to the busbar block 4 of FIG. 4 (the same applies to a case where the busbar block 4 of FIG. 4 is inversely attached to the inner covers 9 of FIG. 5). The busbar block 4 is attached to the inner cover 9 in a later-described state of the circuit board assembly 25 (see FIG. 7).

As shown in FIG. 6, at the same time as attaching of the inner cover 9 to the busbar block 4, the front and rear ribs 23 of the busbar block 4 are each brought into engagement with the front and rear recessed portions of the inner cover 9, i.e., the front-side recessed groove 50 and the rear-side stepwise portion 51, respectively, and thus the positioning of the busbar block 4 relative to the inner cover 9 in the front-to-rear direction is defined with accuracy, so that it is made possible to readily and effectively attach the circuit board assembly 25 (see FIG. 7) that incorporates multilevel busbar block 4, which needs complicated assembling operation, to the inner cover 9.

Even when a pressing force in the longitudinal direction acts upon the bus bar 19 due to the pressing force of the fuse 39 as the tab terminal of the fuse 39 (see FIG. 1) is inserted into and connected to the clamping terminal portion 19*a* of the bus bar 19, the front-side rib 23(*i*) integral with the bus bar 19 abuts on the rear end face 50*b* of the recessed groove 50 of the inner cover 9, and the rear rib 23(*ii*) abuts on the front end face 49*a* of the rib 49 of the stepwise portion 51, and thereby the pressing force (insertion force) of the fuse 39 is accommodated and the rearward displacement of the bus bar 19 is prevented, so that transfer of the force to a solder-connecting portion connecting the pin-like terminal portion 19*b* of the bus bar 19 to the circuit board 2 (FIG. 3) is prevented, and the solder-connecting portion is kept in a safe state.

Also, even when the bus bar 19 is pulled forward as the fuse 39 is inserted and detached, the front-side rib 23(*i*) abuts on the front end face 50*a* of the recessed groove 50, and thereby the frontward displacement of the bus bar 19 is prevented, and transfer of the force to the solder-connecting portion connecting the pin-like terminal portion 19*b* of the bus bar 19 to the circuit board 2 and thus the solder-connecting portion is kept in a safe state.

In this embodiment, the insertion force acting when in insertion of the fuse 39 is accommodated by the upstanding portion 37*b* of the rib 37 in the front-side expanded portion 33 of the inner cover 9, and thus the transfer of the fuse insertion force to the solder-connecting portion to the circuit board 2 is doubly prevented.

The trellis-like rib 48 of the wide base portion 32 of the inner cover 9 allows each of the bus bars 19 to be in abutment with and supported by a small contact area and good insulating property. The pin portion 28 of the inner cover 9 (FIG. 5) is inserted into the positioning hole 27 of the busbar block 4 (see FIG. 4). The circuit board 2 is secured to the inner cover 9 with the circuit board 2 supported by the end of the pin portion 28 and with the screw 31 (see FIG. 1) screwed into the threaded hole 29 of the pin portion 28.

Figure 7:
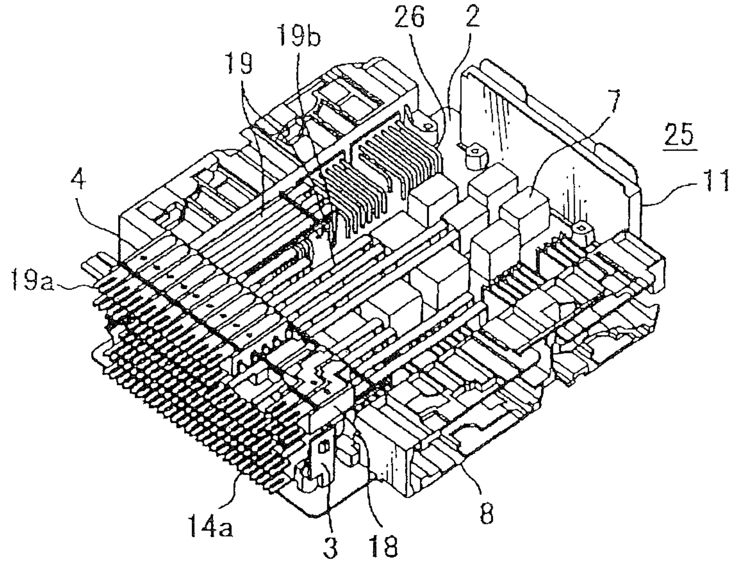
FIG. 7 is a perspective view of the circuit board assembly in an almost complete state.
Figure 8:
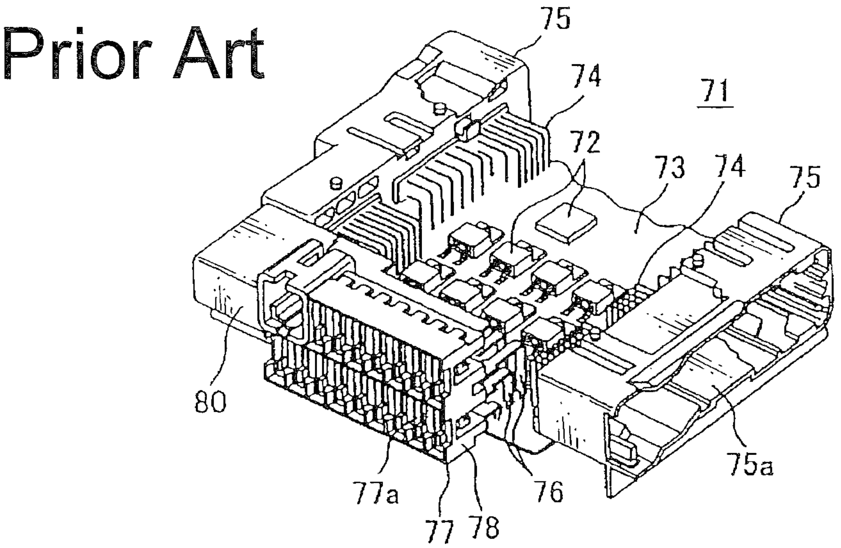
FIG. 8 Prior Art
FIG. 8 is a perspective view of principal part of a conventional junction block.

Referring to FIG. 7, there is shown an example of the circuit board assembly 25 constructed by the circuit board 2, the terminal block 3, the busbar block 4, the connector block 8, the connector 11, and the relay 7. The bus bars 19 each rearwardly extending from the busbar block 4 are horizontally passed over the terminal 26 and the relay 7 of the connector block 8, and inserted into and connected to a hole 16 of the circuit board 2 using a space between the terminal 26 and the relay 7.

Referring again to FIG. 1, the fuse block is constructed by attaching the fuse holder 6 to the terminal block 3 and the busbar block 4. In this state, the circuit board assembly 25 is attached to the inner cover 9. The fuse block is arranged at the front opening of the inner cover 9. The connector block 8 is arranged in the right and left lateral openings of the inner cover 9. The outer cover 10 is attached from above onto the circuit board 2. The both covers 9, 10 are secured to each other by means of a locking element.

In the above-described embodiment, the rear rib 23(*ii*) of the busbar block 4 is brought into engagement with the front-side stepwise portion 51 of the rib 49 of the inner cover 9. In place of the stepwise portion 51, it is possible to provided a recessed groove (recessed portion) in the front holder 9, the recessed groove being similar to the front-side recessed groove 50.

Also, in the above-described embodiment, the busbar block 4 in the form of the circuit board assembly 25 (finished product) (see FIG. 7) is attached to the inner cover 9. Depending on the configuration of the junction block 1, the busbar block 4 may be attached to the inner cover in the form of the circuit board assembly 17 (see FIG. 3), or in the form of a single component as the busbar block 4.

Also, in the above-described embodiment, the front and rear ribs 23 of the busbar block 4 are brought into engagement with the front and rear recessed portions 50, 51 of the inner cover 9, respectively. Although accuracy of positioning will decrease, it is also possible to bring only either one of the front and rear ribs 23 of the busbar block 4 into engagement with either one of the front and rear recessed portions (50 or 51) of the inner cover 9.

Although, in the above-described embodiment, the fuse 39 is connected to the bus bar 19 and the terminals 14, it is also possible to employ a fusible link and a relay in place of the fuse 39 as the electrical component.

Also, the above-described construction of the present invention, in addition to use as the busbar block mounting structure, can serve as a junction block as such.

The invention claimed is:

1. In a mounting structure of a busbar block comprising a plurality of bus bars each having on one side a terminal portion for connection of an electrical component, and on an other side a terminal portion for connection of a circuit board, the bus bars being arranged in parallel with each other on an insulating block body, wherein the block body includes a rib in one piece therewith, the rib being constructed to prevent uplifting of the bus bars, an insulating cover mounted to the busbar block includes a recessed portion for positioning of the rib, and the rib and the recessed portion brought into engagement with the rib defining positioning of the busbar block with respect to the cover simultaneously with mounting of the busbar block to the cover.

2. The busbar block mounting structure according to claim 1, wherein the busbar block and the cover each have a stepwise-bent shape, the block body of the busbar block comprises two ribs of a single assembly, one of the ribs being provided at a front-side bus bar portion, the other of the ribs being provided at a rear-side busbar portion, and the cover comprises two recessed portions of a single assembly for engagement with each corresponding of the ribs.

3. The busbar block mounting structure according to claim 2, further comprising a terminal block provided between the front-side bus bar portion of the busbar block and the circuit board, the terminal block being constructed by a plurality of terminals each having at one end a terminal portion for connection of an electrical component and at an other end a terminal portion for connection of the circuit board, and an insulating block body for holding the plurality of terminals.

4. The busbar block mounting structure according to claim 1, wherein a circuit board assembly includes (a) the circuit board to which the busbar block is connected and (b) a connector block or other electrical components arranged on and connected to the circuit board, and the rib and the recessed portion brought into engagement with the rib define positioning of the circuit assembly when the circuit board assembly is attached to the cover.

5. The busbar block mounting structure according to claim 2, wherein a circuit board assembly includes a circuit board assembly includes (a) the circuit board to which the busbar block is connected and (b) a connector block or other electrical components arranged on and connected to the circuit board, and the rib and the recessed portion brought into engagement with the rib define positioning of the circuit assembly when the circuit board assembly is attached to the cover.

6. The busbar block mounting structure according to claim 3, wherein a circuit board assembly includes (a) the circuit board to which the busbar block is connected and (b) a connector block or other electrical components arranged on and connected to the circuit board, and the rib and the recessed portion brought into engagement with the rib define positioning of the circuit assembly when the circuit board assembly is attached to the cover.

7. The busbar block mounting structure according to claim 1, wherein the insulating cover comprises an dugout-like expanded portion at a front end.

8. The busbar block mounting structure according to claim 7, wherein the dugout-like expanded portion comprises:

a vertical stepwise wall continuing to the front end;

a horizontal wall continuing from the vertical wall frontward;

a side wall upstanding to a lateral side of the horizontal wall;

a plurality of ribs provided on an inner surface of the horizontal wall; and the recessed portion provided at a front side of the ribs.

* * * * *